(12) United States Patent
Huntley et al.

(10) Patent No.: US 6,397,883 B1
(45) Date of Patent: Jun. 4, 2002

(54) EQUIPMENT SKID

(75) Inventors: Graeme Huntley, Brentwood; Kate Wilson, Mountain View, both of CA (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 09/464,184

(22) Filed: Dec. 16, 1999

(51) Int. Cl.⁷ .............................. F16K 27/08; E03B 5/00
(52) U.S. Cl. ...................... 137/382; 137/343; 137/351; 137/565.23; 137/118; 137/728
(58) Field of Search .................... 118/728; 137/343, 137/351, 377, 382, 315.01, 565.23

(56) References Cited

U.S. PATENT DOCUMENTS

| | | | | |
|---|---|---|---|---|
| 4,091,840 A | * | 5/1978 | Grove et al. ................ | 137/343 |
| 4,989,632 A | * | 2/1991 | Bauerle ..................... | 137/343 |
| 5,915,414 A | * | 6/1999 | Seaman et al. ............. | 137/377 |
| 6,102,068 A | * | 8/2000 | Higdon et al. .............. | 137/341 |

\* cited by examiner

Primary Examiner—A. Michael Chambers
(74) Attorney, Agent, or Firm—Ira Lee Zebrak; Salvatore P. Pace

(57) ABSTRACT

An equipment skid for mounting ancillary equipment to support a semiconductor processing tool. The equipment skid comprises a plurality of equipment sections and a service section. The ancillary equipment is mounted within the equipment sections and the plurality of equipment and service sections are connected to one another in an in-line relationship to define a framework to allow external connections between the ancillary equipment and the semiconductor processing tool to pass through a region overlying the footprint of the service section. The equipment and service sections are preferably covered by an enclosure to contain leakage.

7 Claims, 4 Drawing Sheets

EQUIPMENT SKID

BACKGROUND OF THE INVENTION

The present invention relates to an equipment skid to mount ancillary equipment that functions in connection with a semiconductor processing tool. More particularly, the present invention relates to such an equipment skid in which a plurality of equipment sections, used for mounting the ancillary equipment, are connected to a service section so that connections from the ancillary equipment can pass near or through the service section to the semiconductor processing tool.

A semiconductor processing facility is often constructed on two levels. The tools used in fabricating the semiconductors will then be situated on a main level while ancillary equipment will be located on a level beneath the main level known as a sub-fab. Each piece of ancillary equipment situated within the sub-fab will ideally be beneath the tool it services. For instance, many tools incorporate a vacuum chamber. A vacuum pump associated with a particular chamber will then be located beneath such chamber on the sub-fab level.

While the placement of the equipment relative to the tools would appear to use the shortest runs of piping, in practice, however, excessive networks of piping result which can make the layout and servicing of the equipment very difficult. Installation of the equipment is also problematic in that the equipment must not only be assembled within the fabrication facility, but also be tested within such facility. If any piece of equipment proves to be faulty, it and possibly other surrounding equipment must be removed and replaced. A still further problem is that often such tools utilize noxious, dangerous chemicals that are drawn off by, for instance, vacuum pumps for disposal by a variety of types of abatement systems. However, due to the positioning of such pumps within the sub-fab it is difficult to shroud the pumps and associated piping with an enclosure to contain and vent leakage.

As will be discussed, the present invention provides a central mounting arrangement on a skid that cures many of the problems mentioned above.

SUMMARY OF THE INVENTION

The present invention provides an equipment skid for mounting ancillary equipment to support a semiconductor processing tool. The equipment skid includes a plurality of equipment sections and a service section. The ancillary equipment is mounted within the equipment sections and the plurality of equipment and service sections are connected to one another to allow external connections between the ancillary equipment and the semiconductor processing tool to pass within a region overlying a footprint of said service section.

The skid of the present invention therefore provides a central location for mounting the ancillary equipment. Additionally, since a service section is provided for the external connections to the tool, less piping need be used than if equipment were scattered in the sub-fab. In this regard, in laying piping to the sub-fab, the footprint of the overall skid can be chalked out on the floor as a guide with attention given only to the service section to allow for the routing of piping from the main level of the fab. A further point is that the equipment and service sections can be covered by an enclosure to contain leakage. A sensor can be located within the enclosure to detect leakage.

Preferably, the equipment and service sections are connected in an in-line relationship and also can have the same transverse cross-section. This facilitates the use of manifolds and the like to further reduce the amount of piping. For instance, when at least some of the ancillary equipment comprises vacuum pumps, at least one common manifold connects the vacuum pumps and extends into the service section with fittings configured to connect with at least one conduit connected to said semiconductor processing tool. Utility manifolds may also be provided for cooling water or other services. Such utility manifolds are connected to the vacuum pumps and extend into said service section for external utility connection.

As may be appreciated, the use of the equipment skid of the present invention that is built up from sections facilitates the assembly of equipment off-site so that faulty equipment can be replaced before installation in the facility. In this regard, preferably, the equipment and service sections are connected to one another by connection elements that allow for assembly and disassembly of the equipment skid. In a further aspect of the present invention, the ancillary equipment can be mounted within the equipment sections on transversely extending members of tubular configuration to receive the tines of a fork lift vehicle to facilitate installation, removal and maintenance.

BRIEF DESCRIPTION OF THE DRAWINGS

While the specification concludes with claims distinctly pointing out the subject matter that Applicants regard as their invention, it is believed that the invention will be better understood when taken in connection with the accompanying drawings in which:

DETAILED DESCRIPTION

Figure 1:
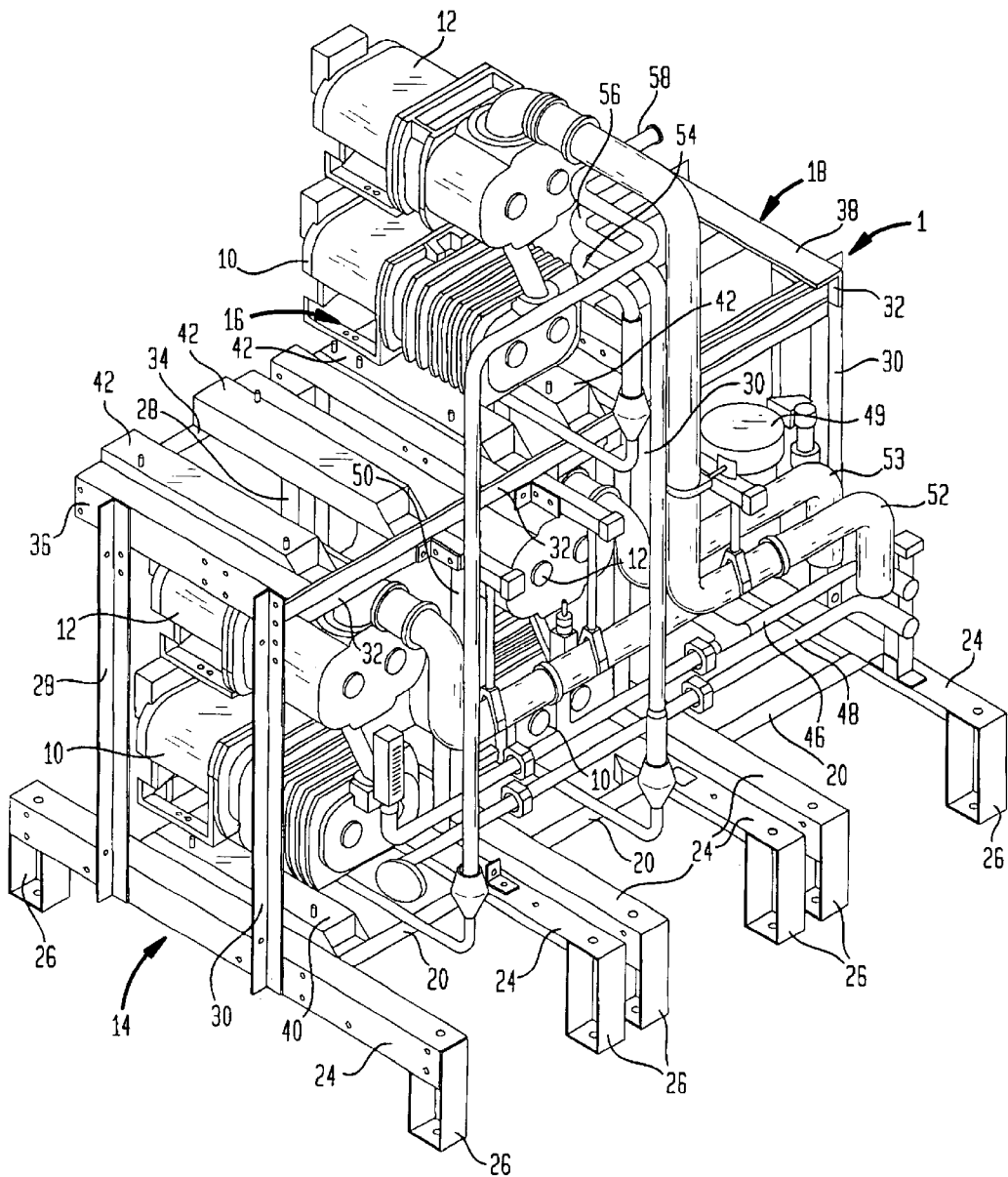
FIG. 1 is a perspective view of an equipment skid in accordance with the present invention.

With reference to FIG. 1, an equipment skid 1 in accordance with the present invention is illustrated as mounting vacuum pumps 10 and associated booster pumps 12. In the illustrated embodiment, equipment skid 1 is provided with equipment sections 14 and 16 for mounting vacuum pumps 10 and booster pumps 12 and a service section 18 as a central point for the connection of vacuum pumps 10 and booster pumps 12 to a semiconductor processing tool and to utilities such as house water.

Figure 2:
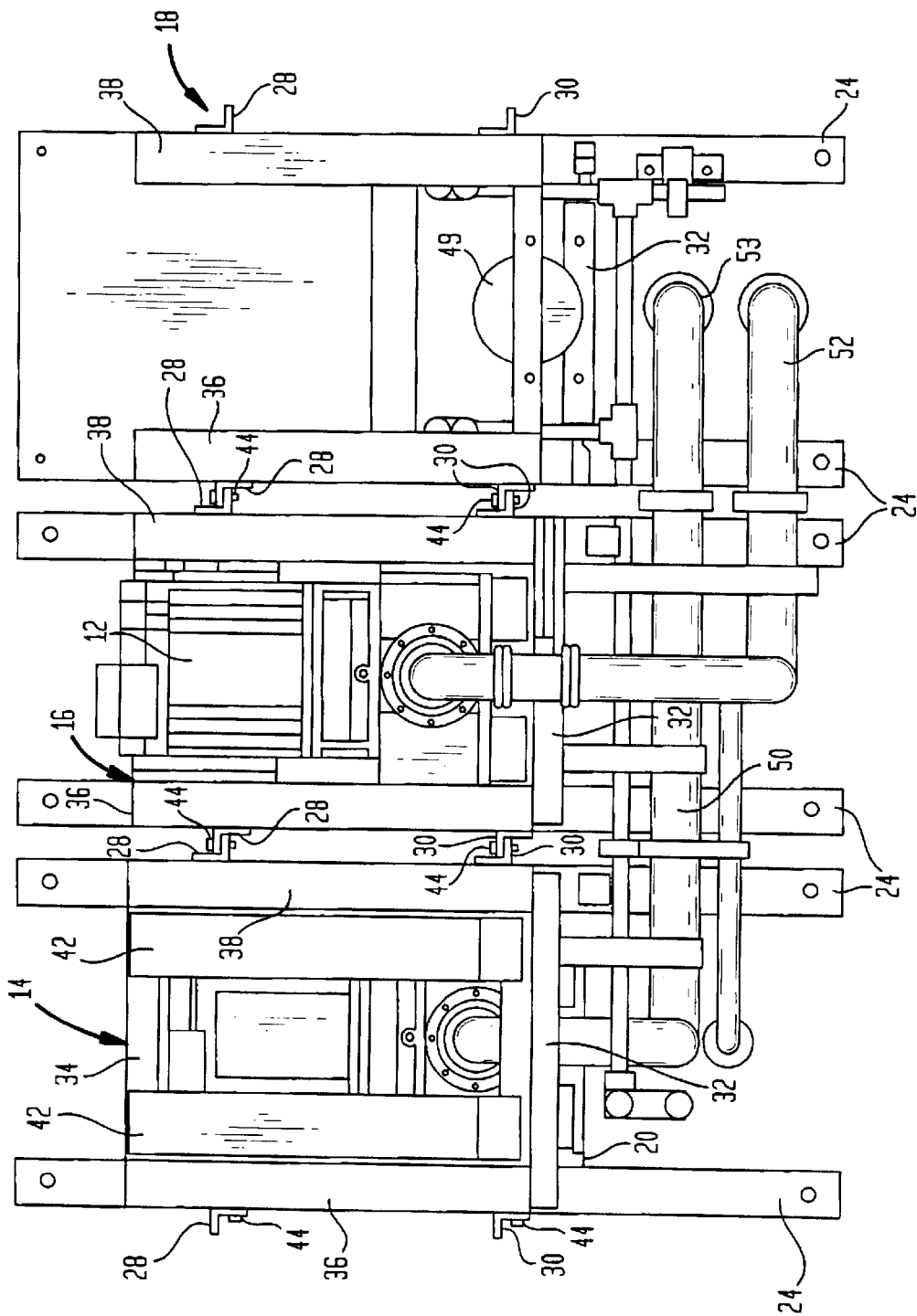
FIG. 2 is a top plan view of FIG. 1.
Figure 3:
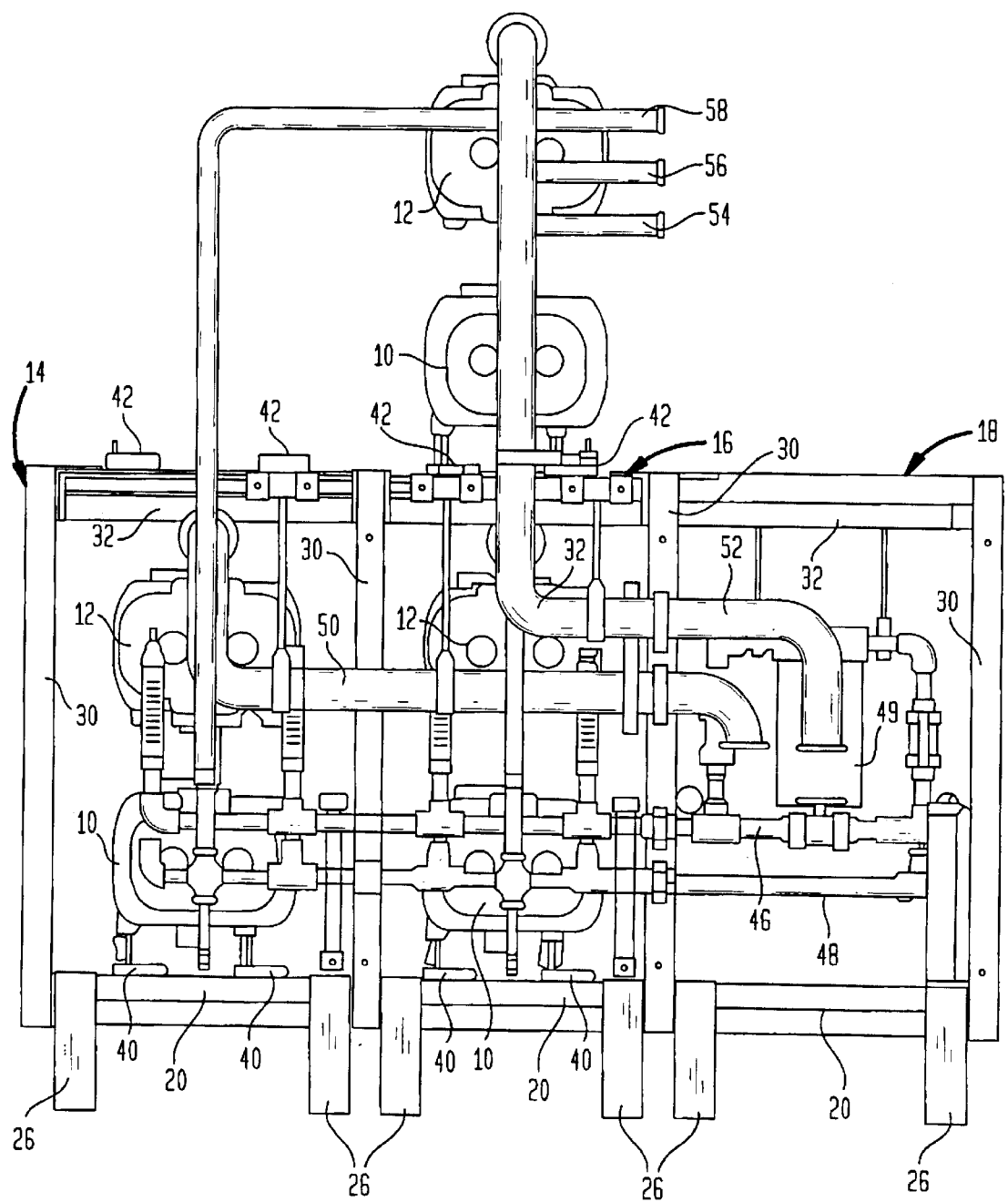
FIG. 3 is a side elevational view of FIG. 1.

With additional reference to FIGS. 2 and 3, each of the equipment sections 14, 16 and the service section 18 is provided with parallel pairs of lower lengthwise members 20 and 22 (See FIG. 4) connected to transverse base members 24 to support equipment and service sections 14, 16, and 18 respectively. Each of the transverse base members 24 are provided with feet 26. Four upright pairs of members 28 and 30 are connected to transverse base members 24. Upper pairs of lengthwise members 32 and 34 and upper pairs of transverse members 36 and 38 connect the tops of upright members 28 and 30 in lengthwise and transverse directions, respectively. Lower and upper transversely extending members 40 and 42 of tubular, box-like configuration are provided for each equipment sections 14 and 16 for mounting vacuum and booster pump pairs 10 and 12. As illustrated, lower and upper transversely extending members 40 and 42 transversely connect lower and upper lengthwise members 20, 22 and 32, 34, respectively. Members 40 and 42 are spaced apart from one another and are configured to receive the tines of a fork-lift vehicle.

Equipment and service sections 14, 16, and 18 and the aforementioned structural members are connected to one another by connection elements that allow equipment and service sections 14, 16, and 18 to be separated, thereby to facilitate disassembly after off-site testing and re-assembly within the fabrication facility. Specifically, the ancillary equipment, vacuum and booster pump pairs 10 and 12 can be separately mounted on equipment sections 14 and 16 with equipment and service sections 14, 16, and 18 temporarily connected to one another for testing purposes. Thereafter, the equipment and service sections 14, 16, and 18 can be separated and reattached on site. To this end, upright members 28 and 30 are fabricated from L-shaped stock and the flanges of such L-shaped stock can be connected to one another by such connection elements as by threaded connectors 44.

Once on site, in the event that maintenance were required for a vacuum and booster pump pairs 10 and 12, the connection elements associated with members 40 and 42 can be disconnected from the relevant equipment section 14 or 16 by their attachment and the members 40 and 42 together with vacuum and booster pumps 10 and 12 can be removed as a unit by a fork lift vehicle. It is to be noted that transverse base members 24 extend outwardly to allow for access to any equipment mounted on equipment skid 1.

Each of the equipment and service sections 14, 16, and 18 are connected in an in-line relationship to help simplify the connection of equipment mounted on equipment sections 14 and 16 to the semiconductor tool and to facilitate passage of such connections through a region overlying the footprint of service section 18. In this regard, the footprint of service section 18 as used herein and in the claims means the area bounded by the feet 26 associated with transverse base members 24 thereof. This provides a central location for such connection to avoid networks of piping within the sub-fab.

Furthermore, equipment and service sections 14, 16, and 18 preferably employ nearly identical construction so that they each have the same transverse cross-section. This facilitates the use of manifolds such as 46 and 48 for connection with house water and drain for cooling purposes. In this regard, manifold 46 that serves as in inlet incorporates a water filter 49. Manifolds 46 and 48 terminate at service section 18 for connection to the appropriate utilities. The pump forelines 50, 52, and 53 all provide a flanged connection at the location of the service section for connection with the associated piping to the semiconductor tool. Although forelines 50, 52, and 53 are shown terminating in down-turned elbows, such elbows could be up-turned or turned in any direction to facilitate the connection to the tool. Exhaust lines 54, 56, and 58 terminate above service section 18 for connection to an abatement system. Supports for such piping could be connected to service section 18. Although not shown, in order to facilitate the separation of equipment and service sections 14, 16, and 18, manifolds 46 and 48, forelines 50, 52, and 53, and exhaust lines 54, 56, and 58 are connected to vacuum and booster pump pairs 10 and 12 by various types of known quick connectors. Such connectors aid in simplifying the disassembly of equipment and service sections 14, 16, and 18 as well as removal of the vacuum and booster pump pairs 10 and 12 for maintenance.

Figure 4:
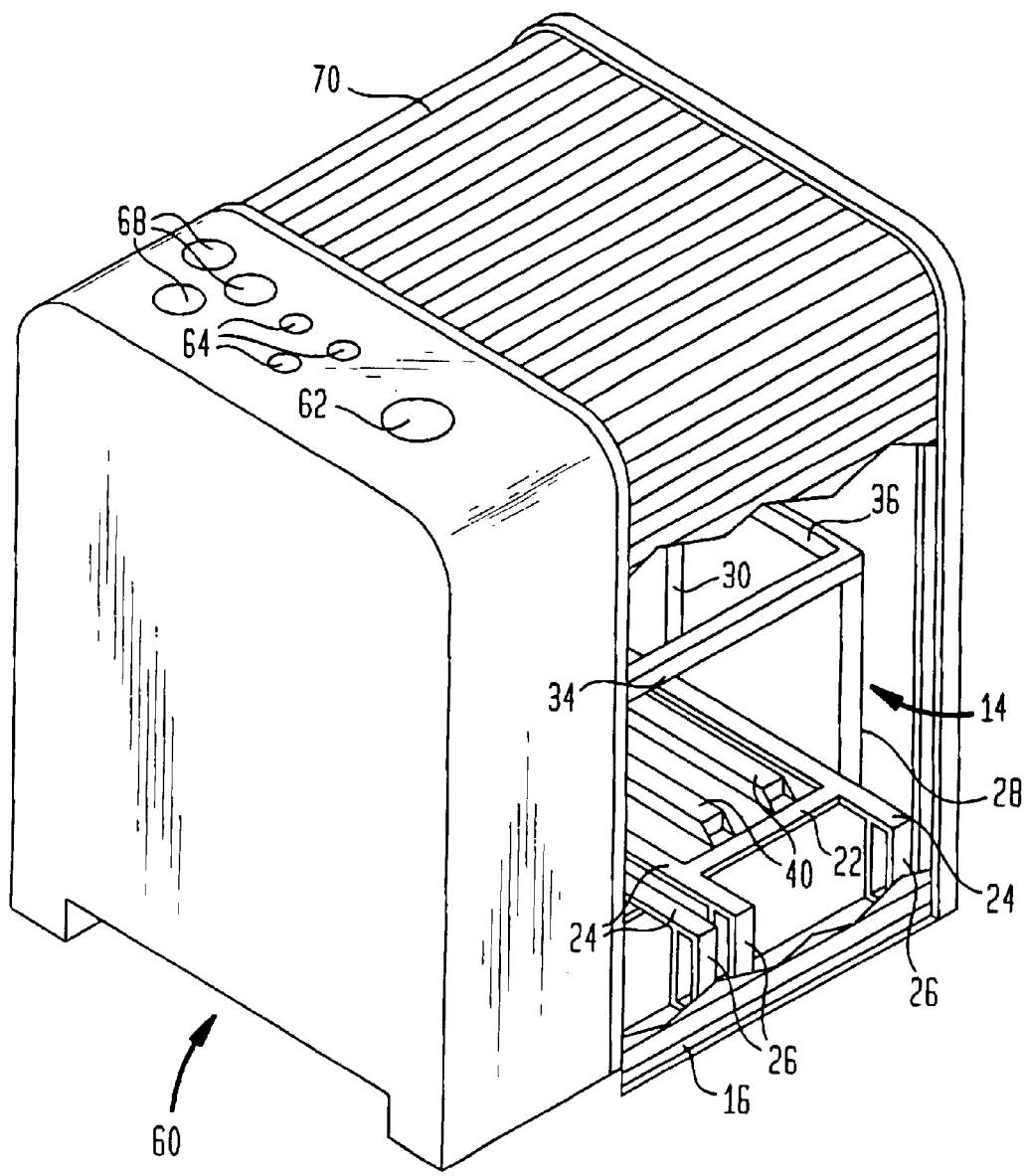
FIG. 4 a perspective view of an enclosure used to contain an equipment skid in accordance with the present invention with portions broken away and with only some components of the equipment skid illustrated.

With additional reference to FIG. 4, equipment skid 1 is illustrated as being covered by an enclosure 60. As stated previously, the advantage of such an arrangement is to contain all leakage from ancillary equipment mounted on equipment skid 1 as well as from associated piping. Enclosure 60 is provided with a vent opening 62 for connection to a system vent. Additionally, openings 64 and 68 are provided for piping to connect with forelines 50, 52, and 53, and exhaust lines 54, 56, and 58, respectively. Other openings, not shown in the particular view of FIG. 4, are provided for facility connections. Access may be provided with a removable roll-type enclosure 70. Although not illustrated, a sensor can be provided within enclosure 60 to detect the leakage.

Additionally, although not illustrated, a common control unit could be provided for vacuum pump and booster combinations 10 and 12 which could also advantageously be set in service section 18. The external controls for operation of such a control unit could be placed on enclosure 60.

Although the present invention has been illustrated by reference to a preferred embodiment, as will occur to those skilled in the art, numbers, changes and additions can be made without departing from the spirit and scope of the present invention.

We claim:

1. An equipment skid for mounting ancillary equipment to support a semiconductor processing tool, said equipment skid comprising:

a plurality of equipment sections; and a service section;

said ancillary equipment mounted within the equipment sections;

the plurality of equipment and service sections connected to one another to allow external connections between said ancillary equipment and said semiconductor processing tool to pass within a region overlying a footprint of said service section.

2. The equipment skid of claim 1, wherein said equipment and service sections are connected to one another in an in line relationship.

3. The equipment skid of claim 1 or claim 2, wherein said equipment and service sections are covered by an enclosure to contain leakage.

4. The equipment skid of claim 1 or claim 2, wherein said equipment and service sections have the same transverse cross-section.

5. The equipment skid of claim 1 or claim 2, wherein said ancillary equipment is mounted within said equipment sections on transversely extending members of tubular configuration to receive the tines of a fork lift vehicle.

6. The equipment skid of claim 1 or claim 2, wherein said equipment and service sections are connected to one another by connection elements that allow for assembly and disassembly of said equipment skid.

7. The equipment skid of claim 4, wherein:

at least some of the ancillary equipment comprises vacuum pumps;

at least one common manifold connects said vacuum pumps and extends into said service section with fittings configured to connect with at least one conduit connected to said semiconductor processing tool;

and utility manifolds for cooling water connect said vacuum pump and extend into said service section for external utility connection.

* * * * *